United States Patent [19]

Reinschmidt et al.

[11] Patent Number: 4,663,741
[45] Date of Patent: May 5, 1987

[54] STROBED ACCESS SEMICONDUCTOR MEMORY SYSTEM

[75] Inventors: Robert M. Reinschmidt, San Jose; Wylie J. Plummer, Felton, both of Calif.

[73] Assignee: Trilogy Systems Corporation, Cupertino, Calif.

[21] Appl. No.: 661,531

[22] Filed: Oct. 16, 1984

[51] Int. Cl.[4] .............................................. G11C 7/00
[52] U.S. Cl. .................................... 365/189; 365/193
[58] Field of Search ............... 365/189, 193, 194, 230, 365/233

[56] References Cited

U.S. PATENT DOCUMENTS 4,397,001 8/1983 Takemae ............................ 365/189

Primary Examiner—Joseph A. Popek
Attorney, Agent, or Firm—Townsend and Townsend

[57] ABSTRACT

An integrated circuit memory system having an array of ECL memory cells, an address circuit, a READ/WRITE circuit and a coupling circuit which increases the operating current of an addressed memory cell during a READ/WRITE operation. The increased operating current is short enough to prevent an excessive saturation of the memory cell transistors. The addressed memory cells remain in a low operating current sufficient to maintain the memory cells in their particular states. Since timing is critical, timing circuits for a system clock are also part of the memory system.

11 Claims, 6 Drawing Figures

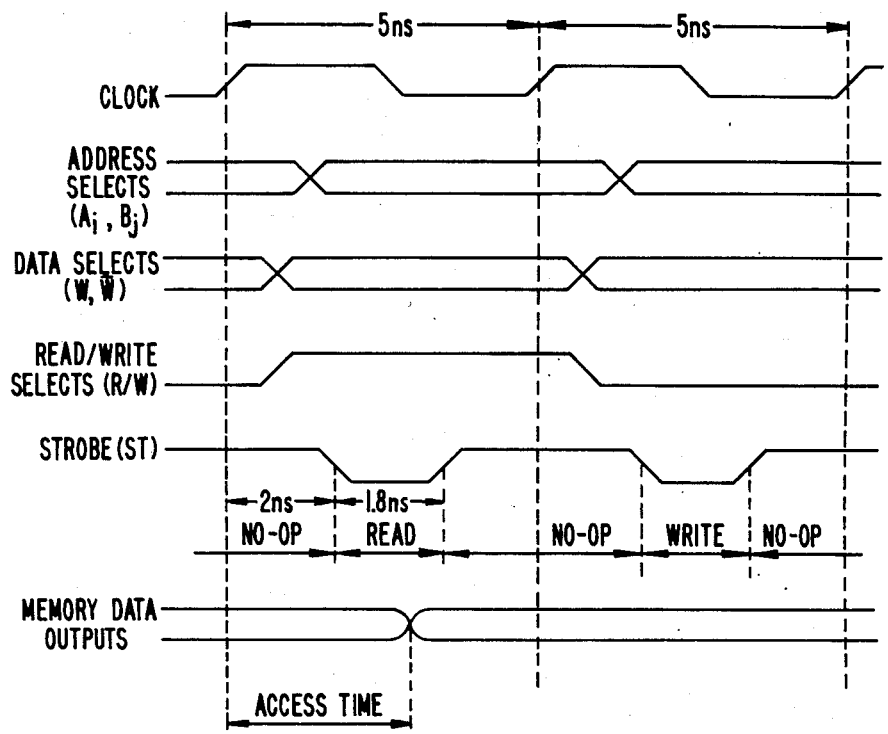
FIG._2.
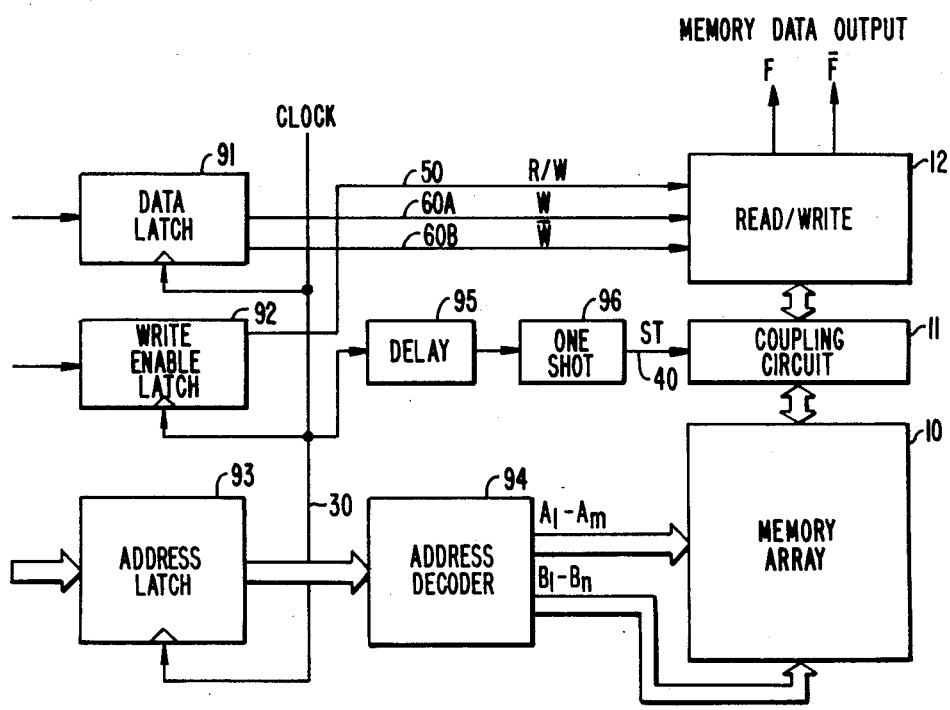
FIG._1.

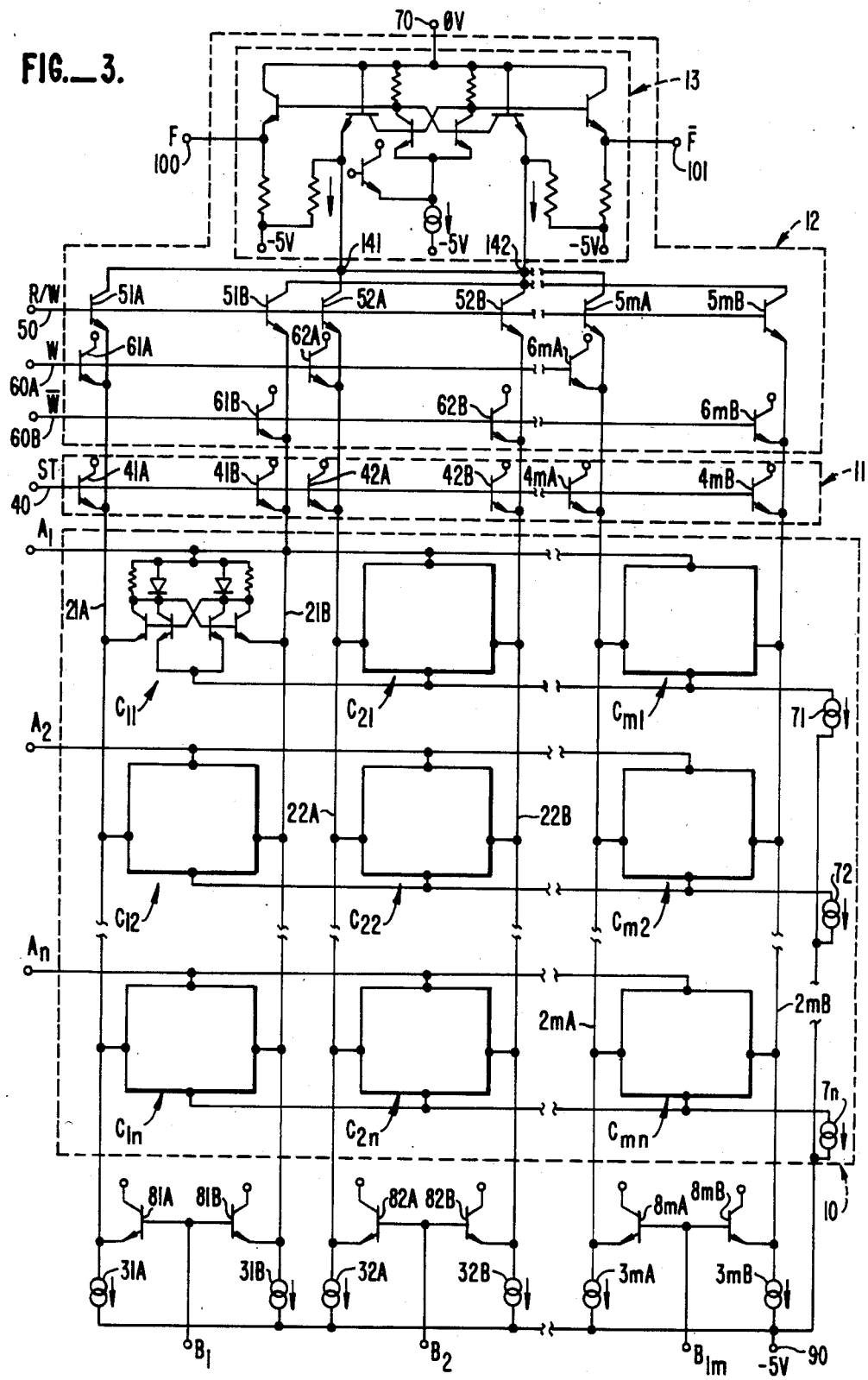
FIG._3.

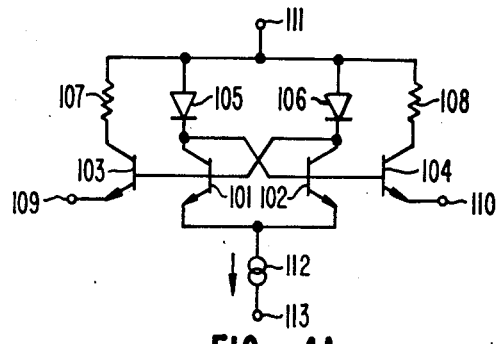
FIG._4A.
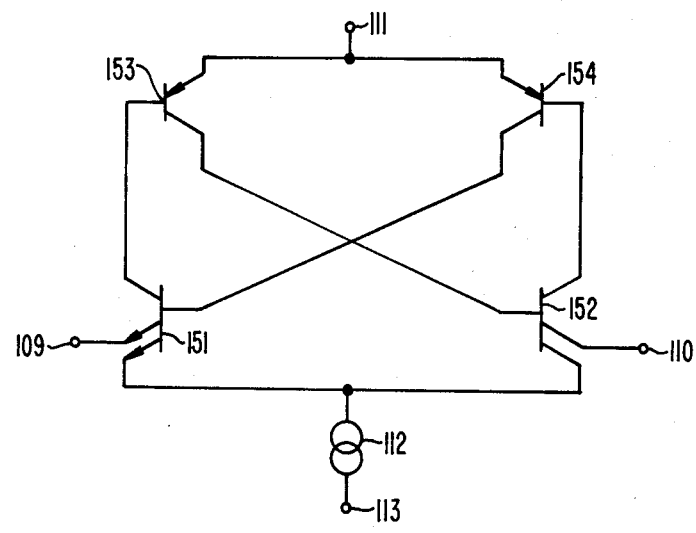
FIG._4B.
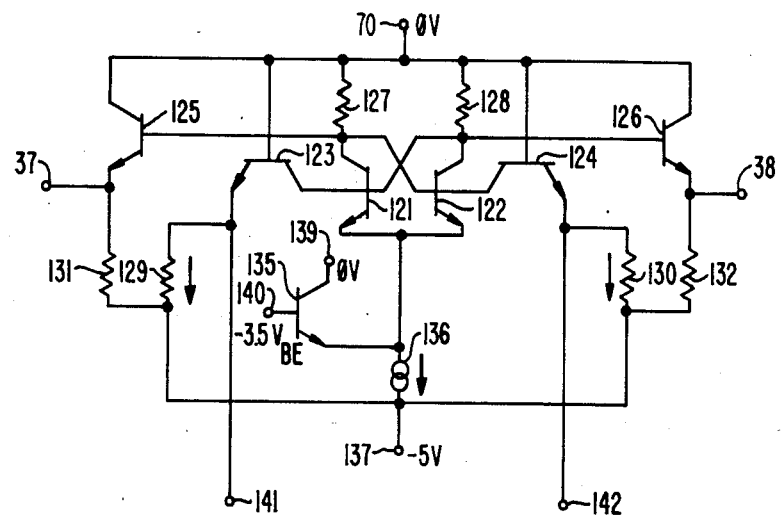
FIG._5.

STROBED ACCESS SEMICONDUCTOR MEMORY SYSTEM

FIELD OF THE INVENTION

This invention relates to electronic systems and, more particularly, high speed, strobed bipolar semiconductor circuits. Specifically, the present invention is applicable to high speed ECL memory circuits.

BACKGROUND OF THE INVENTION

One of the goals of semiconductor electronics is the attainment of higher and higher operating speeds. For these high speed operations, integrated circuits having bipolar transistors are typically used. These digital circuits have transistors which switch from one state to another. Unless some special arrangements are made, these critical switching transistors often go into a saturation mode. In this mode the number of minority carriers is so great within regions of the transistor that the switching time of the transistor is slowed.

One arrangement to prevent saturation is to couple Schottky diodes to the switching transistors. However, this solution requires special steps in many integrated circuit manufacturing processes, such as processes using P type epitaxial layers for the base region of the transistors or processes using polysilicon electrode contacts.

Other arrangements avoiding Schottky diodes are circuit designs requiring no diodes or requiring standard integrated circuit diodes. However, these efforts have not been entirely successful. In integrated semiconductor memory circuits the READ time, the time in which a bit of information is retrieved from a memory cell, and the WRITE time, the time in which a bit of information is stored in a memory cell, have not been as fast as desired in many applications, such as in high speed computers.

The present invention reaches many of the goals of high speed operation, but without the use of Schottky diodes. Instead standard integrated circuit diodes are used requiring no special processing steps. Furthermore, the present invention provides for a memory system having a high density since the basic memory cell which forms the memory array is very compact in size.

SUMMARY OF THE INVENTION

Bipolar switching transistors are typically in the form of a pair of transistors cross-coupled so that the current through the transistors flows in one of two stable states. The present invention provides for a high speed bipolar integrated circuit comprising such a pair of cross-coupled bipolar transistors; means coupled to the transistor pair for maintaining a minimal current flow through the pair sufficient to keep the pair in a stable state; and means coupled to the transistor pair for increasing current flow through the transistor pair for such time to allow the transistor pair state to be switched whereby saturation of the transistors is minimized. The time duration of the increased current flow is controlled such that there is enough time to permit switching the state but not enough time to allow excessive saturation.

The bipolar circuit is implemented in emitter-coupled logic with the emitters of the transistor pair coupled and the maintaining means comprises a current source connected to the emitters so that the minimal current flows through the transistor pair.

The transistor pair in ECL circuit above may be part of an output latch and the increasing means a circuit for coupling a pair of sense lines to bases of the transistor pairs for such time to allow the transistor pair to switch into a state indicative of current flow through the sense line pair.

The transistor pair in the ECL circuit above may also be part of a memory cell in a memory cell array and the increasing means a circuit for increasing the voltage difference between collectors and emitters of the transistor pair for such time as to permit a READ or WRITE operation with the memory cell.

The present invention also provides for a memory system having an array of semiconductor memory cells, comprising an address circuit connected to the memory cell array for selecting one of the memory cells, a READ/WRITE circuit for determining and setting the state of the selected memory cell, a circuit for coupling the selected memory cell to the READ/WRITE circuit in such a manner that the operating current in the selected memory cell is increased to a high operating current during a READ/WRITE operation beyond a low operating current sufficient to maintain the selected memory cell in a particular state, whereby the retardation of switching speeds due to saturation in the memory cell is minimized.

BRIEF DESCRIPTION OF THE DRAWINGS

A full understanding of the present invention may be reached by a perusal of the following detailed description with reference to the drawings described below:

FIG. 1 is a block diagram of the overall memory system of the present invention.

FIG. 2 is a timing diagram of the signals of the present invention.

FIG. 3 is an overall schematic diagram of the memory array, the coupling circuit and READ/WRITE circuit of the present invention.

FIG. 4A is a schematic drawing of one embodiment of the memory cell of the present invention;

FIG. 4B is a schematic drawing of another memory cell embodiment of the present invention.

FIG. 5 is an isolated view of the output latch of the READ/WRITE circuit of the present invention.

DETAILED DESCRIPTION OF PREFERRED EMBODIMENTS

FIG. 1 illustrates a memory system organization having the present invention. A memory array 10 contains an nxm array of memory cells, which may each contain one bit of information. A READ/WRITE circuit 12 either determines the state of a selected memory cell in the array 10 (a "READ" operation) or sets the state of selected memory cell in the array 10 (a "WRITE" operation). During a READ or WRITE operation, a coupling circuit 11 couples the READ/WRITE circuit 12 to the array 11.

Address information to identify a particular memory cell in the array 10 is passed into and held by an address latch 93. The address information is then set into an address decoder 94 which generates signals on the row lines $A_1$-$A_n$ and the column lines $B_1$-$B_m$ to select a particular memory cell.

A bit of information to be written into the array 10 is sent to and held by a data latch 91. The latch 91 communicates the state of the bit to be written by a W line 60A and a complementary $\overline{W}$ line 60B to the READ/WRITE circuit 12.

A write enable latch 92 receives and holds a bit which indicates whether a READ or WRITE operation is to be performed by the READ/WRITE circuit 12. This information is sent to the circuit 12 by a READ/WRITE line 50 from the latch 92.

The present invention employs precise timing to minimize saturating switching transistors in the memory cells of the array 10 and in the READ/WRITE circuit 12. The data latch 91, write enable latch 92 and address latch 93 are responsive to signals on a clock line 30. At the rising edge of each clock signal, each latch 91, 92, 93 is loaded and transmits its contents to the READ/WRITE circuit 12 and address decoder 94.

All these elements, including the timing elements, are in a single integrated circuit. This insures the precise timing of the memory system.

FIG. 2 shows the timing of the system around a 5-nanosecond clock cycle. During each cycle a READ or WRITE operation is performed. To minimize or eliminate saturation of the switching transistors in the READ/WRITE circuit 12 the coupling circuit 11 couples the READ/WRITE circuit 12 to the memory array 10 for only a limited portion of the 5-ns clock cycle. Timing for the coupling circuit is performed by a delay circuit 95 which is set by the rising edge of the clock signal. The delay permits the latches 21, 22, 23 to be loaded and set set before the coupling circuit 11 operates. After a predetermined delay the delay circuit 95 triggers a one-shot circuit 96 which sends a strobe signal on a line 40 to the coupling circuit 11. During the strobe signal the coupling circuit 11 couples the circuit 12 to the array 10.

As shown in FIG. 2, the strobe signal begins some 2 nanoseconds after the rising edge of the clock signal and lasts for some 1.8 nanoseconds. Then the strobe signal ends. For a READ operation the memory data output signals appear some time after the strobe signal begins. Though a WRITE operation follows the READ operation in FIG. 2, the present invention does not require any order of READ and WRITE operations.

The memory system of the present invention is shown in FIG. 3. The memory array 10 has its memory cells $C_{ll}$-$C_{nm}$ arranged in m columns by n rows. In one embodiment of the invention the array is 8 columns by 16 rows. FIG. 1 shows only nine of these memory cells for explanatory purposes.

Each memory cell is connected by a pair of sense lines 21A,B to 2mA,B through the coupling circuit 11 to the READ/WRITE circuit 12. The memory cell $C_{22}$, for example, is connected by the sense lines 22A, 22B. Each of these sense lines is connected one of m pairs of current sources 31A, B - 3mA, B.

A five-volt difference is used to operate the memory system. A first voltage source at zero volts is connected to a power terminal 70 and a second voltage source at minus five volts is connected to second power terminal 90. Since the memory system is implemented in ECL (emitter coupled logic), most of the other voltages given hereafter are in units of $V_{BE}$, about 0.7 volts, the voltage drop of a forward-biased diode in silicon.

The memory system operates in three modes; the READ mode in which data stored in the system is determined, the WRITE mode in which data is transferred into the system for storage, and a standby mode.

In a standby or no-operation mode the coupling circuit 11 decouples the memory cells in the array 10 from the READ/WRITE circuit 12. During a READ or WRITE mode the coupling circuit 11 permits the memory cells to be electrically connected to the READ/WRITE circuit 12 through the sense lines 21A, B-2mA, B.

M pairs of transistors 41A, B to 4mA, B form the coupling circuit 11. The emitter of each transistor 41A, B - 4mA, B is connected respectively to each sense line 21A, B - 2mA, B and the collector of each transistor 41A, B - 4mA, B coupled to the high voltage terminal 70. The bases of the transistors 41A, B - 4mA, B are connected to a control line 40 which carries a strobe (ST) signal to couple and decouple the memory array 10 to and from the READ/WRITE circuit 12.

The READ/WRITE circuit 12 has m transistors 51A-5mA, the emitters of which are respectively connected to the m sense lines 21A-2ma for each column of memory cells in the array 10. The collectors of the transistors 51A-5mA are connected to an input terminal 141 of the latch 13. Similarly, the READ/WRITE circuit 12 has m transistors 51B-5mB which have their emitters connected to the m complementary sense lines 21B-2mB for each memory cell column. The collectors of these transistors 51B-5mB are connected to a complementary input terminal 142 to the latch 13. Communication from the memory cell array 10 to the latch 13 occurs by the current flow, or the lack of current flow, through the transistors 51A, B to 5mA, B when the transistors are turned on. This operation is controlled by a read or write (R/W) signal on the control line 50 connected to the bases of the transistors.

Transistors 61A-6mA and 61B-6mB are also part of the READ/WRITE circuit 12. The emitters of the transistor 61A-6mA are connected respectively to the sense lines 21A-2mA while the emitters of the transistors 61B-6mB are connected to the complementary sense lines 21B-2mB respectively. The collectors of both sets of transistors are connected to the terminal 70 (this connection is not shown). A control line 60A for a WRITE (W) signal is connected to the bases of the transistors 61A-6mA and a control line 60B for a complementary WRITE ($\overline{W}$) signal is connected to the bases of the transistors 61B-6mB. During a WRITE operation, the W and $\overline{W}$ control signals raise and lower the voltages on the sense lines 21A-2mA and the complementary sense lines 21B-2mB in accordance with the information to be stored in the memory array 10.

Operation in the standby (NO-OP) mode has the row address lines $A_1$-$A_n$ and the column address lines $B_l$-$B_m$ at $-3V_{BE}$ and $-2V_{BE}$ respectively. The voltage on the ST line 40 to the coupling circuit 11 is $-2.5 V_{BE}$. This high voltage level turns off transistors 41A-4mA and 41B-4mB of the READ/WRITE circuit 12. The voltages on W and $\overline{W}$ control lines operate between $-2V_{BE}$ to $-3V_{BE}$ and the transistors 51A, B-5mA, B are also off since the voltage on the R/W line 50 is between $-2.3V_{BE}$ to $-3V_{BE}$. Thus the coupling circuit 11 isolates the memory array 10 in the standby mode.

When a READ or WRITE operation is performed, one of the n×m memory cells in the array 10 is selected. From a set of address signals, the address decoder 94 (shown in FIG. 1) generates signals for the row address lines $A_l$-$A_n$ and the column address lines $B_l$-$B_m$ to the memory array 10. The voltage of one of the row lines $A_1$-$A_n$ is raised to $-2V_{BE}$ and the voltage of one of the column lines $B_l$-$B_m$ is lowered to $-3V_{BE}$. The intersection of the raised row line and lowered column line is the selected memory cell. For example, if $A_n$ is raised and $B_2$ lowered, the selected memory cell is memory cell $C_{n2}$.

During a READ operation the R/W signal on the control line 50 is set at $-2.3V_{BE}$ to permit the voltages generated by the selected memory cell to appear on the associated sense lines. The latch 13 responds to these voltages and sets itself according to the state of the memory cell. The W and $\overline{W}$ control control signals for the lines 60A, B remain low at $-3V_{BE}$ to permit the sense lines 21A, B - 2mA, B to operate independently of the transistors 41A, B - 4mA, B. The selected memory cell causes a current imbalance in the currents through the terminal 141, 142 to force the latch 13 into a state corresponding to the state of the selected memory cell.

For a WRITE operation the R/W line 50 falls to $-3V_{BE}$. On the other hand, one of the two W and $\overline{W}$ control lines 60A,B is raised to $-2V_{BE}$ while the other remains low at $-3V_{BE}$. Which line is raised depends upon whether a logic "1" or "0" is to be written in the selected memory cell.

For either the READ or WRITE operation, a strobe signal is placed on the ST line 40 of the coupling circuit 11 by lowering the voltage of the bases of the transistors 41A, B - 4mA, B from $-1.5_{BE}$ to $-2.8V_{BE}$. This permits the transistors 41A, B - 4mA, B and 41A, B - 4mA, B to operate.

As shown in FIG. 2, the strobe signal appears for only a short (1.8 ns) duration for each READ or WRITE operation occurring within the 5 ns clock cycle. This strobe signal forces the cross-coupled switching transistors of a selected memory cell to operate under high current conditions only for a short time. The NO-OP condition between strobe signals allows the switching transistors to recover so that the amount of stored charge in the transistors is small each time the transistors are forced to switch during a strobe signal.

The cross-coupled transistors 101, 102 of an individual memory cell are shown in FIG. 4a.

The pair of cross-coupled transistors 101, 102 have their emitters commonly connected to a current source 112 and the base of each transistor is connected to the collector of the other transistor. The collectors of these two transistors 101, 102 are respectively connected to a terminal 111 by a pair of matching diodes 105, 106. The diodes are standard junction diodes formed in a semiconductor substrate as part of an integrated circuit. Schottky diodes, which may require special processing, are not used. Each of the first pair of transistors 101, 102 has associated with it one of a second pair of transistors 103, 104. The transistor 103 has its base connected to the base of transistor 101 and has its collector connected to the terminal 111 through a resistor 107. Similarly, the transistor 104 has its base connected to the base of the transistor 102 and has its collector connected to the terminal 111 through a resistor 108. The resistors 107 and 108 have matching resistances.

The current source 112 is shown with the memory cell of FIG. 4A for purposes of explanation and represents the current sources 7l–7n which are connected to the rows of memory cells, as seen in FIG. 3. The terminal 113 corresponds to the connecting nodes of each of the current sources 7l–7n and is set at $-5$ volts. Similarly, the terminal 111 represents the connecting node to one of the $A_l-A_n$ row address lines for each row of memory cells. As explained previously, the voltage of the terminal 111 varies depending upon whether that particular row of memory cells has been selected.

The current source 112 maintains a small current just sufficient to maintain the first pair of switching transistors 101, 102, in one of two possible stable states of the memory cell. Either the transistor 101 is on and nearly all of the current to the current source 112 passes through the diode 105 and the transistor 101. The transistor 102 is off, in this case. To go into the other state of the memory cell the transistors 101, 102 must each switch states so that the transistor 102 is on and the transistor 101 is off.

At the beginning of a READ operation cycle, the selected memory cell starts in the NO-OP mode. The R/W signal is high, and both the W and $\overline{W}$ signals are low. The signal on the ST line 40 is high. The actual READ operation commences with the lowering strobe signal on the line 40. At this point the selected memory cell has already been addressed so that the voltage on the terminal 111 is raised to $-2V_{BE}$ and the voltage on the corresponding column line B, $-B_m$ is lowered to $-3V_{BE}$. When the strobe signal lowers the sense lines, the switching transistor 101, 102, which is on, is turned fully on. For example, the transistor 101 is on and the transistor 102 is off the transistor 103 turns on as the voltage difference between the terminals 111 and 109 increases. The operating current of the memory cell increases passing through the resistor 107 and the emitter of the transistor 103. On the other hand, the transistor 104 remains off. Thus if the contents of the memory cell is to be determined, the current sink of the sense line connected to the terminal 109 draws its current from the transistor 103. Since the transistor 104 is off, the current sink of the sense line connected to the terminal 110 draws its current from the output latch 13 which is discussed later. This difference in current sources affects the latch 13 and the state of the memory cell is determined.

FIG. 4B illustrates another memory cell useful in the present invention. The same reference numerals are used where the portions of this memory cell coincides with that in FIG. 4A. The NPN switching transistors 151, 152 are cross-coupled through a pair of PNP load transistors 153, 154. The base of the transistor 151 is connected to the collector of the transistor 154, while the base of the transistor 152 is connected to the collector of the transistor 153. The bases of the transistors 123, 124 are respectively connected to the collectors of the transistors 151, 152. The emitters of the transistors 153, 154 are connected to the terminal 111.

The transistors 151, 152 each have two emitters, one connected to the current source 112 and the other connected to the terminals 109 or 110. Operationally the memory cell operates identically to the memory cell in FIG. 4A. In the memory cell at hand, the function of the transistors 101 and 103 are emerged into the double-emitter transistor 151 and the function of the transistors 102,104 into the transistor 152. Like the previous memory cell, no Schottky diodes are used in the memory cell.

As shown in FIG. 2, the WRITE operation also begins in a NO-OP state. Then the R/W line 50 of the READ/WRITE circuit 12 is set low. The W line 60A is set low and the $\overline{W}$ line 60B is high or vice versa depending upon the logic state to be written. The actual operation occurs when the strobe signal occurs and the ST line 40 is lowered. If, for example, the W line 60A is low, then the switching transistor 103 of the selected memory cell turns on. On the other hand, the complementary transistor 104 remains off since the $\overline{W}$ line 60B is high. The first pair of transistors 101, 102 are forced into this cell state. Of course, if the W line were high and the $\overline{W}$ low, the selected memory cell is forced into opposite cell state. Then the strobe signal is removed, the ST line 40 goes high and the memory cell goes back into the NO-OP mode.

WRITE times are fast since the memory cell has a high operating current during a strobe cycle at which time the coupling circuit 11 permits the READ/WRITE circuit 12 to determine the state or change the state of the selected memory cell. The strobing action allows the memory cell to switch quickly. The presence of a large number of minority carriers in the transistor and diodes of a prior art memory cell caused by a large operating current is avoided. Hence, in a WRITE operation especially, the high operating current is long enough to set the state in the desired memory cell but short enough to avoid excessive saturation of the switching transistors. A large operating current occurs only during the strobed READ or WRITE operation. The transistors and diodes of a memory cell have sufficient recovery time during the NO-OP mode before the next strobed operation.

The present memory cell also allows for a compact design in an integrated circuit since the cell has only four single-emitter transistors and two diodes. Schottky diodes are avoided.

FIG. 5 illustrates the circuit schematics of the latch of the present invention. The latch 13 has a pair of cross-coupled switching transistors 121, 122 which have their emitters commonly coupled to a current source 136. The bases of the one transistor of the pair is connected to the collector of the other transistor and their collectors are connected to the first power terminal 70 at zero volts through a matched pair of resistors 127, 128. This pair of transistors 121, 122 provides the flip-flop action so that the latch 13 has either the transistor 121 turned on and the transistor 122 off or vice versa. The emitters of the transistors 121, 122 are maintained at a constant voltage level by the action of a transistor 135 which has its base maintained at a constant voltage level of $-3.5V_{BE}$. The collector of the transistor 135 is maintained at zero volts. Thus the emitters of the transistors 121 and 122 are maintained at one $V_{BE}$ below the voltage of the base of the transistor 135. The purpose of this voltage maintenance is to enhance in the switching speed of the two transistors 121, 122 during a READ cycle.

The pair of transistors 121, 122 are each connected to a second pair of transistors 123, 124, which have their collectors connected to the bases of the transistors 121, 122 respectively. The bases of the transistors 123, 124 are connected to the terminal 70 and the emitters of these transistors are connected to the terminals 141, 142. As shown in FIG. 1, the terminal 141 is coupled to the m sense lines 21A-2mA for m columns of memory cells. The terminal 142 is coupled to the m complementary sense lines 21B-2mB for the m columns of memory cells.

During the strobed portion of a READ cycle one of the terminals 141, 142 lines draws current from one of the pair of transistors 123, 124 to turn that transistor fully on. This draws current into the collector of the transistor 123 or 124 from the base of the associated transistor 121 or the transistor 122 which gets current from the resistors 128 or 127 respectively. The transistor 121 or 122 is then turned off. The flip-flop formed by the two transistors 121 and 122 will remain in that state until the next READ operation. For example, if the sense line connected to the terminal 142 draws current from the transistor 124, the transistor 122 will turn off. On the other hand, the sense line connected to the terminal 141 does not draw current from the transistor 123 and the transistor 121 is on. The latch will remain in this state even after the READ operation is completed.

A matched pair of resistors 129, 130 which are respectively connected to the emitters of the transistors 123, 124 maintain a small current (approximately 50 microamperes) through the transistors 123 and 124 during non-READ operation times. The small currents in these two transistors maintain them in an active state so that the two transistors 123, 124 can operate very quickly to speed the latching action compared to a latch without the transistors 123, 124 maintained in an ON state.

The pair of transistors 125 and 126 are the two output transistors which have the two output terminals 37, 38 coupled respectively to the emitters of the transistors 125, 126. With the pair of resistors 131, 132 they form the well-known emitter follower configuration.

However, if a WRITE Operation does follow a READ operation, the status of the memory output remains unchanged from the previous READ cycle. Thus the bit of stored information which was accessed in the previous five nanosecond clock cycle may be READ even during a WRITE operation. This is a very useful feature especially in high speed computers which may be using the memory system as a scratch pad or core memory system.

The embodiment of this invention has been illustrated with mostly NPN transistors. Naturally the invention can also be formed by PNP transistors. Other variations such as inverting the logic signals, can also be made.

Accordingly, while the invention has been particularly shown and described with reference to the preferred embodiments, it would be understood by those skilled in the art that changes in form and details may be made therein without departing from the spirit of this invention. It is therefore intended that an exclusive right be granted to the invention as limited only by the metes and bounds of the appended claims.

What is claimed is:

1. A memory system in one integrated circuit having an array of semiconductor memory cells, comprising
    an address circuit connected to said memory cell array for selecting one of said memory cells,
    a READ/WRITE circuit for reading and writing the state of said selected memory cell,
    a circuit for coupling said selected memory cell to said READ/WRITE circuit in such manner that current in said selected memory cell is increased to a high operating current during a READ or WRITE operation beyond a low operating current sufficient to maintain said selected memory cell in a particular state, for high switching speeds in said memory cell.

2. The memory system as in claim 1 wherein said READ/WRITE circuit is connected to said selected memory cell by a pair of sense lines through said coupling circuit, said coupling circuit permitting communication between said READ/WRITE circuit and said selected memory cell through said sense lines only during a predetermined time within a clock cycle.

3. The memory system as in claim 2 wherein said memory cell comprises a flip-flop coupled to a pair of transistors, each transistors having an emitter respectively connected to one of said pair of sense lines, said flip-flop connected between a first voltage and a first current source to maintain said flip-flop in a logic state when said memory cell remains unselected, each of said sense lines is connected to a second current source.

4. The memory system as in claim 2 wherein
said READ/WRITE circuit comprises transistors having emitters coupled to said sense lines and bases responsive to control signals in a predetermined voltage range for operating said transistors, and said coupling circuit comprises transistors having emitters coupled to said sense lines and bases responsive to control signals in a second predetermined voltage range in such a manner that coupling circuit transistors maintain a first voltage on said sense lines to prevent said READ/WRITE circuit transistors from operating and a second voltage on said sense lines during said predetermined time with said clock cycle to permit said READ/WRITE circuit transistors to operate.

5. The memory system as in claim 4 wherein said READ/WRITE circuit comprises
a pair of first transistors, each having its emitter connected to one of said pair of lines respectively, a collector coupled to a first voltage source, and a base connected to one of two control lines, so that responsive to a WRITE signal on one of said two control lines, a WRITE operation may be performed through said one of said pair of sense lines.

6. The memory system as in claim 5 wherein said READ/WRITE circuit further comprises
a latch having a pair of input terminals,
a pair of second transistors, each having an emitter connected to one of said pair of sense lines respectively, a base connected to a third control line and a collector connected to one of said pair of latch input terminals so that responsive to a signal on said third control line, the state of said selected memory cell is determined by said latch during a READ operation.

7. The memory system as in claim 6 wherein said address circuit comprises
means for increasing the voltage difference between said first voltage source and said connected sense lines for a selected memory cell.

8. The memory cell as in claim 7 wherein said voltage increasing means includes means for raising the voltage of said first voltage source and means for lowering the voltage of said sense lines.

9. The memory system as in claim 7 further comprising
an address, a data and a WRITE ENABLE latch to respectively set said address circuit, said READ/WRITE circuit and said coupling circuit, said address, data and WRITE ENABLE latches responsive to a clock signal so as to be loaded synchronously.

10. The memory system as in claim 9 further comprising
a delay circuit and a one-shot circuit for controlling the arrival of said clock signal to said coupling circuit wherein said coupling circuit is timed with respect to said address, data and WRITE ENABLE latch loading.

11. The memory system as in claim 1 wherein said operating current is increased during a WRITE operation for a time sufficient to permit said memory cell to switch but not long enough to cause excessive saturation of stored charges in said cell.

* * * * *